(12) United States Patent
Hunt et al.

(10) Patent No.: US 6,177,884 B1
(45) Date of Patent: Jan. 23, 2001

(54) INTEGRATED POWER LINE METERING AND COMMUNICATION METHOD AND APPARATUS

(75) Inventors: Paul C. Hunt, Pequot Lakes; Steven Mose Burnham, Brainerd, both of MN (US)

(73) Assignee: Hunt Technologies, Inc., Pequot Lakes, MN (US)

( * ) Notice: Under 35 U.S.C. 154(b), the term of this patent shall be extended for 0 days.

(21) Appl. No.: 09/191,287

(22) Filed: Nov. 12, 1998

(51) Int. Cl.[7] .................................................. G08B 23/00
(52) U.S. Cl. ........................ 340/870.02; 340/870.07; 340/310.01; 324/126; 324/127
(58) Field of Search ...................... 340/870.02, 870.17, 340/870.28, 310.01, 310.07, 870.03, 870.07; 324/126, 127, 142

(56) References Cited

U.S. PATENT DOCUMENTS

| | | | |
|---|---|---|---|
| 4,794,327 | * 12/1988 | Fernandes | 324/126 |
| 5,247,454 | * 9/1993 | Farrington et al. | 364/483 |
| 5,426,360 | 6/1995 | Maraio et al. | |
| 5,467,011 | * 11/1995 | Hunt | 340/310.01 |
| 5,590,179 | 12/1996 | Shincovich et al. | |

FOREIGN PATENT DOCUMENTS 1461912  1/1977  (GB) .
10-271572  10/1998  (JP) .

OTHER PUBLICATIONS

Preliminary Installation Instructions, Hawkeye 8035/8036 Modbus Energy Meter Networked kW/kWH Transducer, *Preliminary Literature,* Veris Industries, Inc., Portland, Oregon, pp. 1–6 (Apr. 15, 1998).

* cited by examiner

*Primary Examiner*—Michael Horabik
*Assistant Examiner*—Timothy Edwards, Jr.
(74) *Attorney, Agent, or Firm*—Merchant & Gould P.C.

(57) ABSTRACT

A quick connect power line metering and communication apparatus and method for measuring energy consumption or other electrical characteristics on a power line and for communicating the measured information to a remote location. The apparatus includes a housing, and a coupling mechanism attached to the housing to physically connect the housing to a suspended portion of the power line, and to provide an electrical connection to at least one conductor of the power line. A metering apparatus is provided within the housing, and is electrically coupled to the power line conductors via the coupling mechanism to measure energy consumption. The metering apparatus includes a current monitor and a voltage monitor to measure the energy consumption on the power line. A communications apparatus is provided within the housing, and is electrically coupled to the metering apparatus. The communications apparatus communicates information corresponding to the measured energy consumption to a remote location.

31 Claims, 8 Drawing Sheets

INTEGRATED POWER LINE METERING AND COMMUNICATION METHOD AND APPARATUS

FIELD OF THE INVENTION

The present invention relates generally to automated meter reading and communication equipment. More particularly, the present invention relates to a power line meter for measuring the energy consumption on a power line and communicating information pertaining to the measured energy consumption to a remote location.

BACKGROUND OF THE INVENTION

Electric Kilowatt Hour (kWh) meters are widely used to measure the consumption of energy supplied by a power source(s) via power lines, such as those supplying electrical power to a consumer's home or office. As is known, electrical power is measured in watts (i.e., Joules per second), and for convenience is often measured in kilowatts. Typically, utility companies charge power consumers for kilowatt-hours consumed over time. Where power is the amount of energy per unit of time, a kWh is defined as the amount of work done at a constant rate of one kilowatt for one hour, and is therefore a unit of energy. Electric kWh meters therefore provide an indication of the energy consumed over time, yet are often casually referred to as power meters. These "power" meters are typically employed by electric utility companies in order to charge each consumer for the amount of electrical energy that was consumed over a period of time.

Traditional kWh meters included mechanical rotors connected to numeric display wheels via a set of gears. Periodically, such as every month, a person visually read a number corresponding to the energy consumption that was displayed on the wheels, and forwarded the reading to the electric utility for subsequent billing of the consumer. This type of process was costly, slow, and intrusive to customers.

In order to alleviate some of the problems associated with the traditional approach, other approaches have more recently been employed resulting in the evolution of power/kWh meters into fully-electronic, yet more costly, metering devices. Many of these meters utilize electronic techniques to measure the consumed energy and display the total on electro-optical readouts, and some even have features allowing the measured kWh information to be sent to the electric utility via electronic communication devices using pager and modem technologies. However, in spite of the electronic communication abilities of these electronic meters, the typical electronic kWh meters have had visual readouts on them, which limited the package design and mounting locations for the meters.

In addition to pager, modem and other auxiliary communications techniques, it is also conceivable that the information is transmitted via the power line itself. One particularly advantageous manner for communicating data representing a kWh meter reading is disclosed in U.S. Pat. No. 5,581,229 ('229), commonly assigned to the assignee of the present invention. In the '229 system, a transmitter is mounted in an existing power meter, and is electrically coupled to the power line. A data signal from a kWh meter, representing the amount of energy consumption, is modulated by the transmitter and sent at low frequencies over the power lines to a receiver, which receives and demodulates the transmitted signal to restore and process the original data signal. The unique transmission system described in the '229 patent therefore describes a data transmission system designed for the transfer of information via the power line itself. The information transmission occurs at a lower frequency than the frequency of the power signal being distributed on the power distribution line. Such low frequency control signals allows for longer transmission links, and reduces the chance that the information will interfere with the electrical power transmission. Furthermore, a low frequency signal can pass through transformers and capacitors with minimal signal degradation, and without the aid of additional equipment such as repeaters. As will be described in further detail below, the present invention is particularly beneficial when used in connection with such an information transmission system, or in connection with other communications systems where information is transmitted using the power line as the information transfer medium.

Among electric utilities worldwide, kWh meters are generally available in two common package types. The plug-in meter, referred to as an S-base meter, is popular in North America. This type of meter is plugged into a socket, or meter base, that is typically located on a pole or pedestal, or an outside wall of a building. The A-base meter is popular in much of the rest of the world. The A-base meter is usually connected to the power wires with screw terminal-type connections, and are usually positioned similarly to S-base meters.

Electric kWh metering is important to power utilities to provide fair and efficient service. When metering is not used, consumers can be very wasteful which collectively causes all consumers utility costs to rise. When metering is employed, each consumer pays his or her fair share—at least in theory. For example, when a consumer uses more energy relative to other consumers, that consumer should pay more. However, because KWh meters essentially represent the electric utilities' cash registers, they become a target for graft, corruption and tampering.

Most conventional kWh meters have to be physically viewed to obtain a reading, which means that the meter has to be located such that utility personnel are able to read it. This typically results in the meter being in plain sight of consumers, tempting some to rewire, bypass, slow down, damage or otherwise tamper with the meters. This further tends to make the utility personnel directly accessible to the consumers, which, particularly in developing countries, has presented an entirely different type of chicanery. For example, in many developing countries, it is known that power consumers often convince the utility personnel to "modify" the energy reading using various forms of coersion, bribery and extortion. This significant problem has led to substantial financial losses for the utility companies.

Prior art meters are typically mounted within an electrical box, or on a pole or other rigid structure to which the power line is also secured. These mounting positions also typically make the meter accessible to consumers. For example, a meter mounted in an electrical box within the consumer's home is clearly accessible to the consumer, which eases tampering if the consumer chooses to do so.

In addition to these human-oriented problems, a meter device also has to survive environmental factors such as temperature and humidity extremes, sunlight, bugs, rain, lightning, and physical abuse from animals, weather and humans. The problems surrounding the use of visual meter displays and the need for utility personnel to read the meters are exacerbated by such adverse conditions and events.

Accordingly, there is a need for a metering apparatus and technique that avoids most, if not all, of the above-noted concerns. The present invention minimizes tampering related to the metering and forwarding of energy consumption information, and effectively eliminates the possibility of fraudulent activity resulting from the human element. The present invention therefore overcomes these and other problems of the prior art, and offers a variety of advantages over the prior art.

SUMMARY OF THE INVENTION

The present invention generally relates to a power line metering and communications apparatus and method for measuring the energy consumption and other electrical characteristics on a power line, and communicating measured information to a remote location. This is effected using a single module attachable directly to the power lines distributed to a power consumer. The design of the apparatus allows it to be quickly and easily connected both physically and electrically to the power line so that it is capable of sensing current and voltage in the power line conductors. Since both the current and voltage can be sensed by the meter, the energy consumption can be measured, and information pertaining to the measured energy consumption can be communicated by the meter to a remote location. The meter does not require a visual display or other read-out, since physical reading of the meter is eliminated. Further, since the meter is mounted directly to the power line, the meter is generally in an unobtrusive, hard to reach location, thereby reducing theft, fraud and vandalism. The invention provides wire support and strain relief mechanisms which facilitate connection to a suspended portion of a power line.

In accordance with a first embodiment of the invention, a power line metering and communication apparatus is provided for measuring electrical information, such as energy consumption, on a power line. The apparatus includes a housing, and a coupling mechanism attached to the housing to physically connect the housing to a power line under strain, and to provide an electrical connection to at least one conductor of the power line. A metering apparatus is provided within the housing, and is electrically coupled to the power line conductors via the coupling mechanism to measure energy consumption. The metering apparatus includes a current monitor and a voltage monitor to measure the power line current and voltage. A communications module is also provided within the housing, and is electrically coupled to the metering apparatus. The communications module communicates information corresponding to the measured electrical information to a remote location. In one particular embodiment, the information is communicated via the power line itself, such that no additional wires or connections are required other than the connection to the power line. In yet another more specific embodiment, the information is communicated via the power line using an ultra narrow bandwidth technology such that the information is communicated at a very low frequency using the power signal as a subcarrier, thereby allowing use of low power transmitters and reliable long range transmissions. In various embodiments of the invention, the metering and communications apparatus detects and communicates a variety of electrical information such as current-related, voltage-related, and energy consumption information.

In accordance with another aspect of the invention, a system for metering and communicating power consumption information is provided. The system includes a power source to provide a power signal, such as a power source provided at a utility substation. Power distribution lines distribute the power signal from the power source to one or more power consumers. The system also includes an integrated power metering and communication apparatus for each of the power consumers, to measure the power consumption of each of the power consumers. The integrated power metering and communication apparatus includes a housing, and a coupling mechanism attached to the housing to physically connect the housing to a free-standing or non-secured portion the power distribution line, and to provide an electrical connection to the conductors of the power distribution line. A metering apparatus is provided in the housing which is electrically coupled to the power distribution line conductors via the coupling mechanism to measure power consumption. The metering apparatus includes at least a current monitor and a voltage monitor to measure the current and voltage on the power distribution line. The system also includes a communications module within the housing, which is electrically coupled to the metering apparatus to communicate information corresponding to the measured energy consumption to a remote location via the power distribution line.

In accordance with another aspect of the invention, a method of metering energy consumption on a power line is provided. The method includes physically attaching a housing to a suspended portion of the power line, where the housing contains at least a metering apparatus for measuring energy consumption, and a communications apparatus. Strain relief for the portion of the suspended power line attached to the housing is provided from within the housing, thereby requiring no external strain relief. The metering apparatus are electrically coupled to the power line, and the amount of energy consumed via the power line is measured. The energy consumed is calculated using current and voltage values, and a resulting energy consumption signal is transmitted to a remote location. In one embodiment of the invention, this signal is transmitted to a receiving office via the power line itself, thereby eliminating the need for additional wiring or connections.

In accordance with yet another embodiment of the invention, an integrated metering and communications apparatus capable of being coupled to a power line to measure power consumption on the power line is provided. The integrated metering and communications apparatus includes a metering mechanism to measure at least the power line current and power line voltage on the power line. A communication mechanism, integrated with the metering mechanism, communicates information derived from the power line current and voltage measurements to a remote location across the power line conductors. The communication mechanism and the metering mechanism share one or more power conditioning and regulation components, and the communication mechanism comprises an ultra narrow bandwidth transmitter to communicate the information across the power line conductors at a frequency less than a frequency of a power signal provided on the power line conductors.

A variety of additional advantages of the invention will be set forth in part in the description which follows, and in part will be obvious from the description, or may be learned by practice of the invention. The advantages of the invention will be realized and attained by means of the elements and combinations particularly pointed out in the claims. It is to be understood that both the foregoing general description and the following detailed description are exemplary and explanatory only and are not restrictive of the invention as claimed.

DETAILED DESCRIPTION OF THE ILLUSTRATED EMBODIMENTS

In the following description of the various embodiments of the invention, reference is made to the accompanying drawings which form a part hereof, and in which is shown by way of illustration various embodiments in which the invention may be practiced. It is to be understood that other embodiments may be utilized, and structural and functional modifications may be made, without departing from the scope of the invention.

The present invention is directed to a dual energy metering and communication apparatus capable of being commonly housed in a single package which can be clamped onto a energy consumer's power distribution line. This allows the entire metering and communication functionality to remain within the "utility domain," and completely out of the energy consumer's premises. No additional wires or circuits need be supplied by the consumer, or connected to any part of the consumer's property. The device does not require physical reading or viewing by utility personnel, and can be packaged to be remarkably resistant to environmental conditions. The device is conveniently clamped onto consumers' power lines so that no metering or communication device is required within the consumers' premises, and further greatly reduces the consumer's accessibility to the device.

Further, the present invention is capable of being clamped on to a suspended portion of a power line. The ability to attach the device to a suspended power line is significant, as the metering and communications apparatus can be located external to, or beyond the reach, of the consumer. The invention is capable of being securely attached to such a suspended power line, even though the suspended nature of the line causes the power line to be under strain, due for example, to tensile stress. Wire securing mechanisms and strain relief measures are provided solely by the device itself, thereby eliminating the need for external strain relief, and eliminating the need to have either the power line or the meter secured to a rigid structure such as an electrical box, pedestal or pole. In fact, the present invention can be conveniently positioned at any desired point along the power distribution line associated with a particular power consumer.

Figure 1:
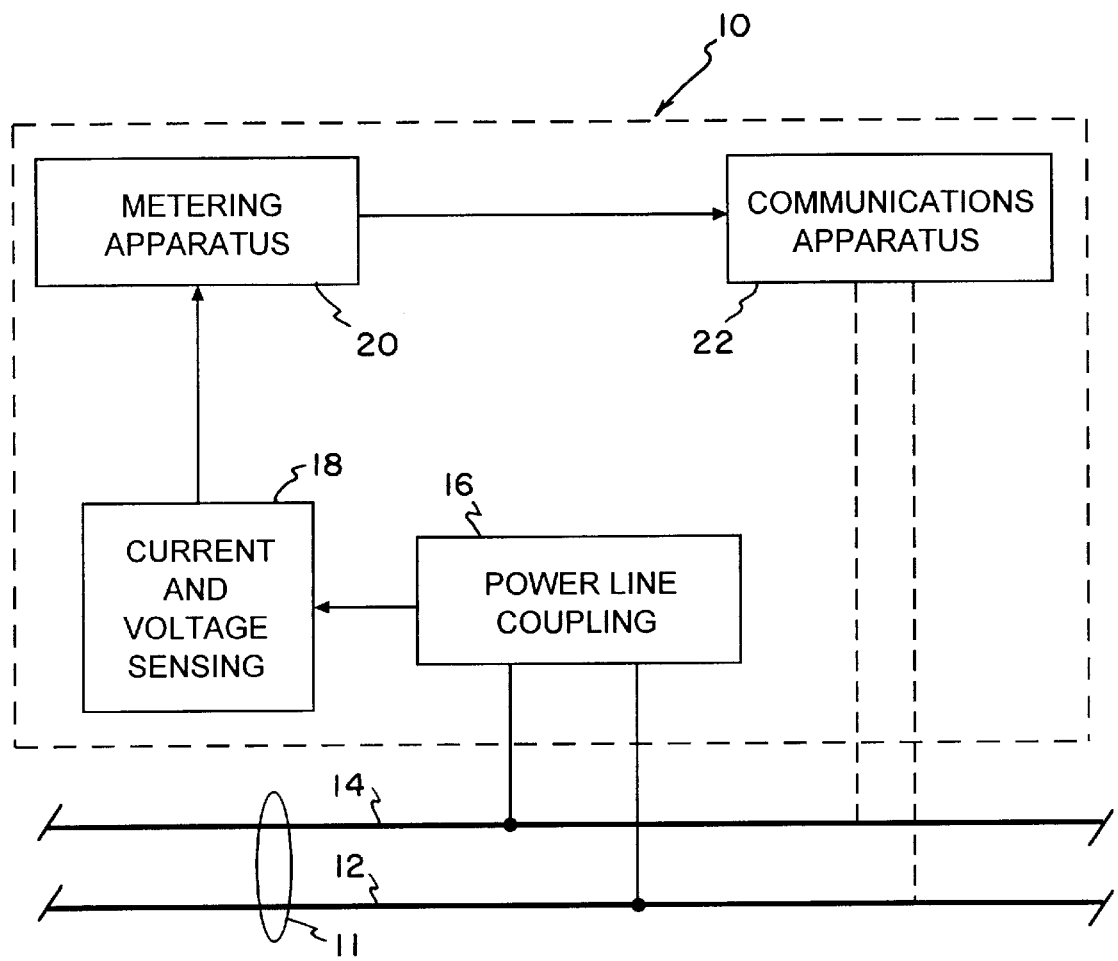
FIG. 1 is a block diagram illustrating the power line metering and communication apparatus in accordance with one embodiment of the invention.

With reference to FIG. 1, a first embodiment of the invention illustrates a power line meter 10 that connects to a power line 11 containing at least a live or "hot" wire 12 and a neutral wire 14. The power line meter 10 is designed to connect to the power line 11 in such a manner to allow sensing of both current and voltage in the power line in order to determine therefrom the energy consumption of a consumer supplied by the power line 11. Further, the power line meter 10 is designed to communicate information pertaining to the measured energy consumption, as well as other desired information, to a remote location. This eliminates the need for a person to read the meter to obtain the energy consumption information.

As depicted in FIG. 1, the meter 10 includes a power line coupling 16 which connects the meter 10 to the wires 12, 14 in such a manner to allow the meter 10 to access both current and voltage in the live wire 12. Current and voltage sensor(s) 18 are electrically connected to the coupling 16 so as to sense the current and voltage. Current and voltage sensing is generally known in the art. Metering apparatus 20, connected to the sensor(s) 18, determines the energy consumption based upon the sensed current and voltage, and the measured energy consumption is output to a communications apparatus 22 for transmission to a remote location, such as a utility substation or utility billing office.

Since the meter 10 is designed to access both the current and the voltage in the power line 11, an outside source of power is not needed to operate the meter, and both the metering apparatus 20 and the communications apparatus 22 are advantageously capable of being integrated into a single unit. Therefore, the single meter 10 can be mounted to power lines in locations that make it difficult to access, thereby alleviating many of the human-oriented problems previously described.

In one embodiment of the invention, the metering apparatus 20 includes a metering integrated circuit connected to the current and voltage sensor(s) 18 to receive the sensed current and voltage values. The metering integrated circuit outputs pulses representative of the energy consumption. For example, the metering integrated circuit can be configured to output one pulse per watt-hour or per kilowatt-hour of energy consumed, as determined by an analysis of the sensed current and voltage. A suitable metering integrated circuit is the 7550 integrated circuit manufactured by Analog Devices, Inc., of Norwood, Mass.

The metering apparatus 20 of the present invention is configured to receive current and voltage information from the current and voltage sensors 18, and ascertain the resulting power consumption. The power consumption is used to provide the pulses at the predetermined time (i.e., kilowatt-hour, etc.). It should be recognized that the manner in which meter information from the metering apparatus 20 is provided to the communications apparatus 22 will determine the type of signal used therebetween. For example, the metering apparatus 20 may output an optical "pulse" at the appropriate time, and the communications apparatus 22 would then receive the pulse using an optical receiver mechanism. However, other manners of providing such signal can be used, such as a hard-wired signal. Such a signal need not be in the form of a pulse, and could alternatively be in the form of a Boolean logic level wherein a toggle from one level to the other represents the desired unit of energy consumed. Furthermore, although the metering apparatus 20 has been described in one embodiment as an integrated circuit, other configurations and types of metering apparatus, including other electronic and mechanical meters, can alternatively be used without departing from the scope and spirit of the invention.

The communications apparatus 22 can take on various forms as well. For instance, in one embodiment of the invention, the communications apparatus 22 communicates the measured energy consumption (as well as other information) via radio frequency transmission to a remote location, such as the electric utility or billing office. In another embodiment of the invention, the communications apparatus communicates via wire to a remote location, as illustrated by dashed lines in FIG. 1. In this embodiment, the information is communicated via the power line itself. The communications apparatus 22 can be coupled directly to the power line 11, or can be coupled through the power line coupling 16. In one embodiment, the power line coupling 16 provides both the connection required to sense the current and voltage, and the connection to the communications apparatus 22 to transmit the meter information to the remote site.

Information can be transmitted via the power line using various power line carriers. For example, it is conceivable to modulate the meter information signal onto a high frequency signal on the power line. While there are several significant drawbacks to transmitting a high frequency signal on the power line 11, the communications apparatus 22 of the present invention can be in the form of a known high-frequency signal modulation device. Despite the present invention's ability to operate in such a high frequency environment, a preferred embodiment of the invention is for the communications apparatus 22 to transmit a low frequency signal. The information transmission occurs at a frequency lower than the frequency of the power signal being distributed on the power distribution line. Such low frequency control signals allows for longer transmission links, and reduces the chance that the information will interfere with the electrical power transmission. Furthermore, a low frequency signal can pass through downstream transformers and capacitors with minimal signal degradation, and without the aid of additional equipment such as repeaters.

Such a communications apparatus that transmits information via a power line at low frequency is further described in connection with FIG. 10, and in U.S. Pat. No. 5,581,229 ('229 patent) entitled "Communication System For A Power Distribution Line" which is assigned to the assignee of the instant application. This communications technology is generally referred to as Ultra Narrow Bandwidth (UNB) communication. In the '229 patent, a data signal from the metering apparatus 20 can be modulated onto a carrier signal using a transmitter associated with the communications apparatus 22. In one particular embodiment, the modulated signal is transmitted at a low frequency to a receiver at a remote location, where the signal is demodulated to restore the original data signal.

In other embodiments of the invention, communications apparatus 22 can be transmitted via other hard-wired techniques. For example, the wire for sending the modulated signal can alternatively be a hard-wired signal to a modem, or a signal transmitted via a telephone line. Other hard-wired such as serial or parallel communications may also be employed, such as transmission via RS-232, RS-485, and other standard or proprietary protocols. While the present invention is capable of use with any of these types of communication apparatus, preferred manners of transmitting the information is via one or more of the conductors comprising the power line or via RF transmission directly from the meter 10. This allows the customer/consumer premises to remain isolated from any contact or association with the meter 10.

Figure 2:
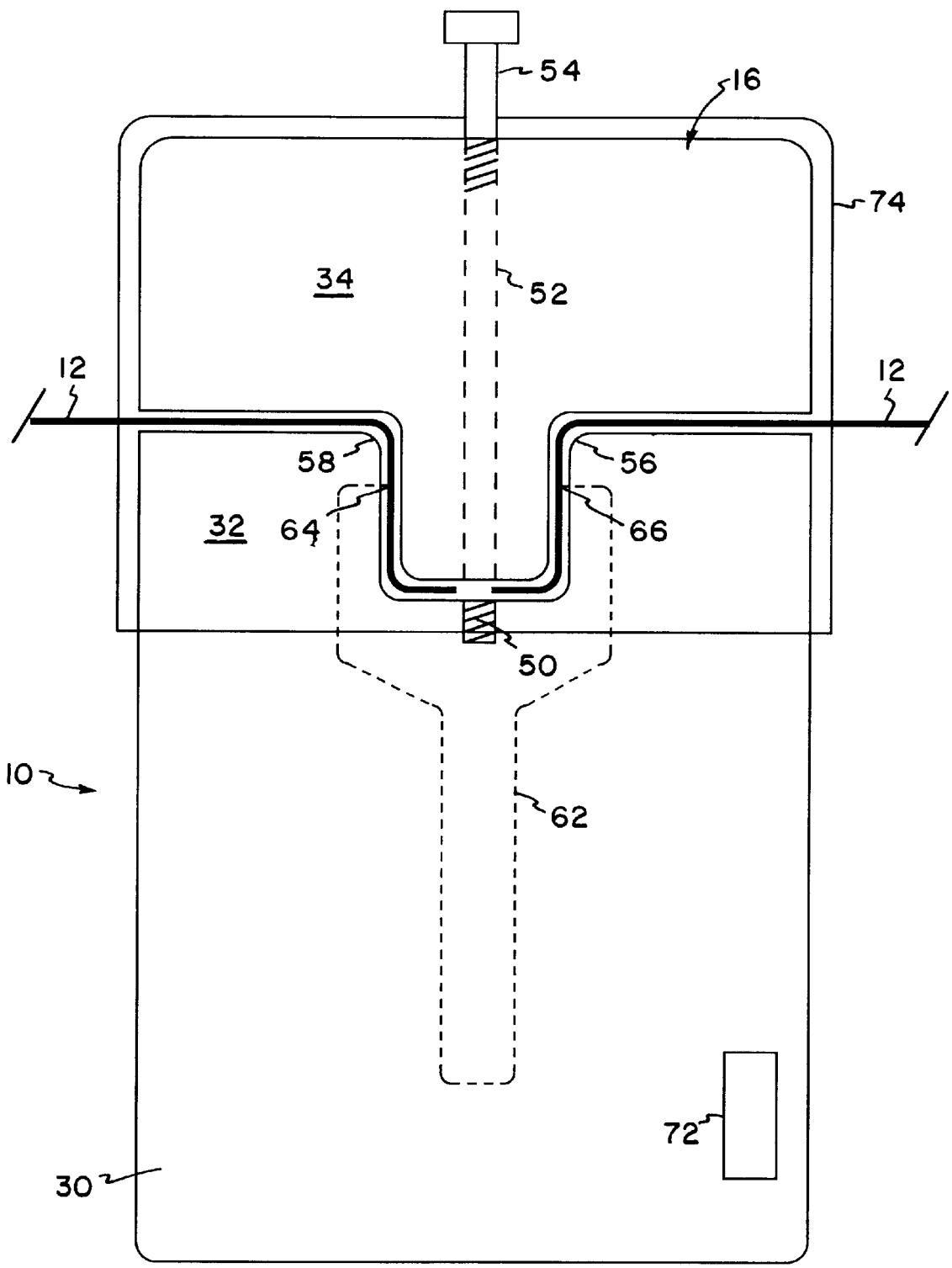
FIG. 2 is side view of one embodiment of the power line meterering and communication apparatus.
Figure 3B:
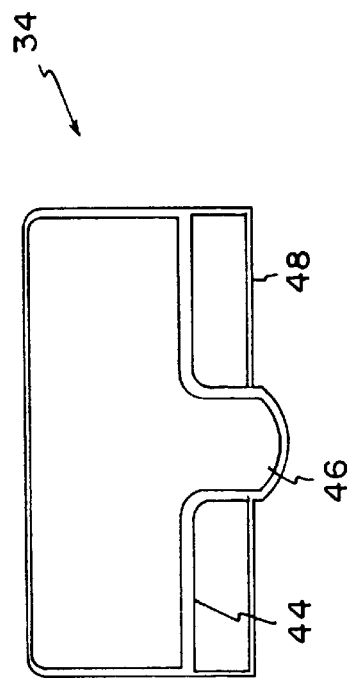
FIG. 3B is a side view of a second portion of the clamp mechanism.
Figure 3A:
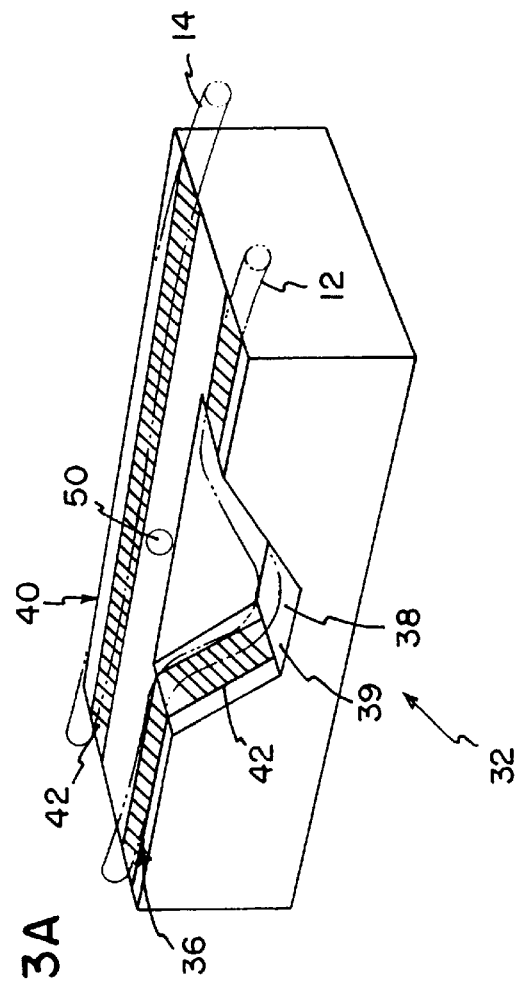
FIG. 3A is a perspective view of one portion of a clamp mechanism in accordance with one embodiment of the invention.
Figure 4:
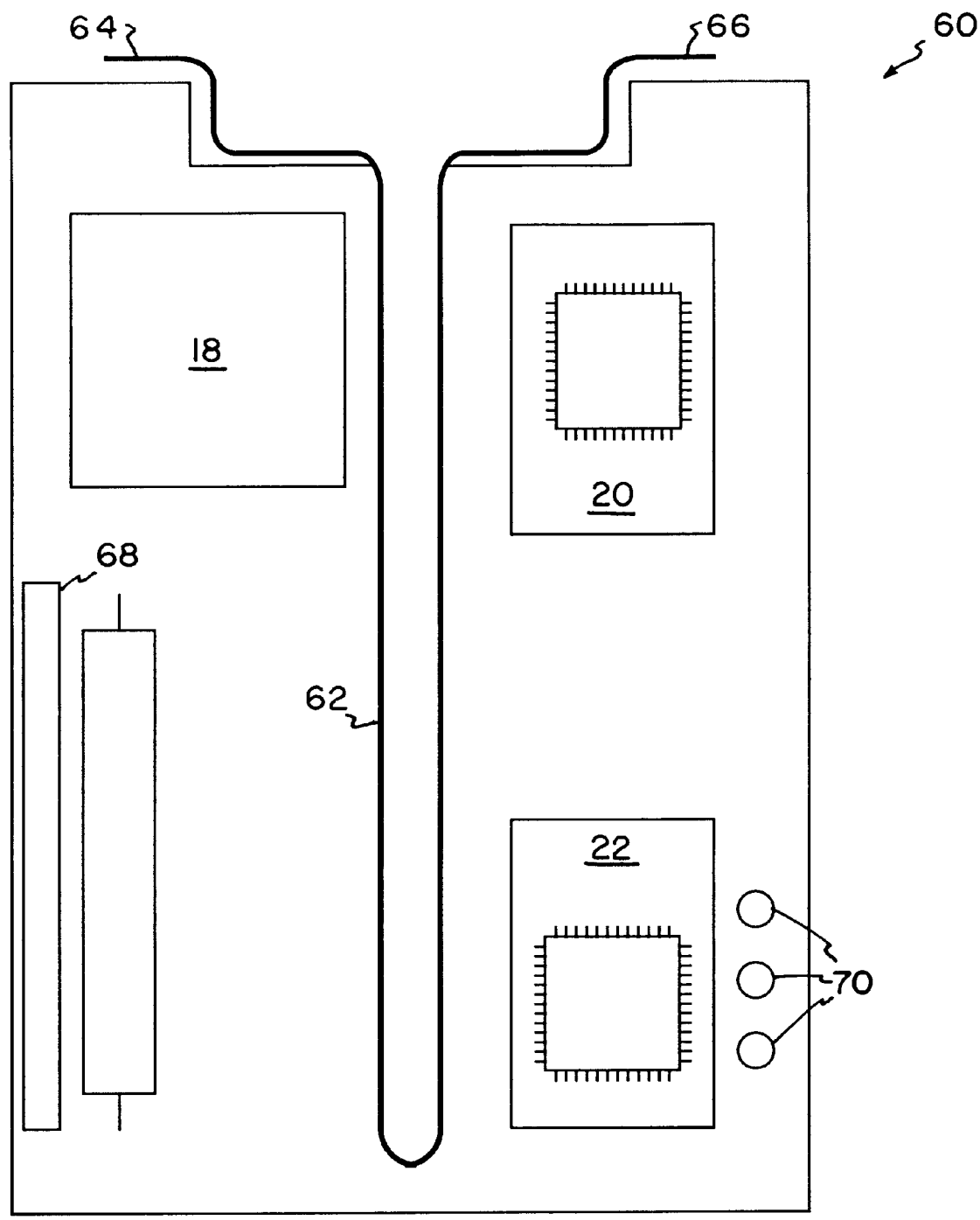
FIG. 4 represents an example of a circuit board contained within the power line meterering and communication apparatus that illustrates the various major functions controlling its operation.

One specific embodiment of the meter 10 will now be described with reference to FIGS. 2, 3A, 3B and 4, where it is seen that the meter 10 includes an enclosure 30 for housing the current and voltage sensor(s) 18, the metering apparatus 20 and the communications apparatus 22. The power line coupling 16 in the example of FIG. 2 is in the form of a clamping mechanism, and is provided at one end of the enclosure 30 for clamping onto the power line 11 including wires 12, 14. The embodiment shown in FIGS. 2–4 is suited for use with bare wires 12, 14 where the insulation has been removed from a portion thereof so that the coupling 16 is able to achieve good electrical contact with the wires 12, 14.

The clamping mechanism forming the coupling mechanism 16 includes a first clamp portion 32 integral with one end of the enclosure 30, and a second clamp portion 34 that is adapted to generally mate with, and be fixed to, the first clamp portion 32. As illustrated in FIG. 3A, the clamp portion 32 includes a side 36 having a pocket 38 formed therein, and a side 40 that is generally flat. The side 36 receives the live wire 12, while the flat side 40 receives the neutral wire 14.

Each of the sides 36, 40 is provided with a conductor layer 42 to provide electrical contact with the wires 12, 14 when the meter 10 is connected thereto. The conductor layer 42 can be made from various conductive materials, such as copper. The conductor layer 42 on the side 36 is not provided on the base surface 39 of the pocket 38 such that a non-conductive gap is formed at the base of the pocket in the conductor layer 42.

The second clamp portion 34 is shaped to mate with the clamp portion 32. As shown in FIG. 3B, the clamp portion 34 includes a side 44 having a projection 46 formed thereon for disposition within the pocket 38, as well as a flat side 48 for disposition over the flat side 40 of the clamp portion 32.

In one embodiment, a threaded insert 50 is disposed within the clamp portion 32 between the two sides 36, 40. In addition, the clamp portion 34 is formed with a through-hole 52, depicted with dashed lines in FIG. 1, which is aligned with the threaded insert 50. A threaded member 54, such as a bolt, extends into the through-hole 52 and into threaded engagement with the threaded insert 50, whereby the clamping portion 32 and the clamping portion 34 are secured together with the wires 12, 14 securely clamped therebetween.

When the clamp portion 34 is brought toward the clamp portion 32 to clamp the wires 12, 14 therebetween, the projection 46 engages the wire 12 and forces it down into the pocket 38 as shown in FIG. 2. Once the clamp portion 34 is properly positioned on the clamp portion 32, the threaded member 54 is then used to fix the clamp portion 34 in place. The conductor layers 42 contact the bare portion of the wires 12, 14, thereby electrically connecting the meter 10 to the wires 12, 14 so that the voltage and current in the wire 12 can be accessed by the meter 10. Further, the edges 56, 58 of the pocket 38 act as strain reliefs to relieve strain in the wire 12 when the wire is forced down into the pocket 38.

It is significant that clamp portions 32 and 34 securely clamp the wires 12, 14 within the device. This allows the meter to be attached to a suspended or "non-secured" power line. In other words, the device of the present invention can be coupled to any portion of the power line, even where the power line is not secured to a structure. In prior art systems, devices attaching to the power lines are typically mounted to a rigid structure, or the power lines themselves are secured to a rigid structure to provide wire strain relief. The present invention, on the other hand, is equipped with clamping segments and strain relief mechanisms to allow the device to operate in connection with a wire under strain, without requiring external strain relief. Therefore, even power lines encountering a great deal of tensile stress can be equipped with a metering and communications apparatus in accordance with the present invention.

As mentioned above, the enclosure 30 houses the current and voltage sensor(s) 18, the metering apparatus 20 and the communications apparatus 22. FIG. 4 illustrates a circuit board 60 that is disposed within the enclosure 30, which contains circuitry for operating the meter 10. In particular, it can be seen that the metering apparatus 20, such as the integrated circuit described previously, and the communications apparatus 22, are mounted on the circuit board 60. In one embodiment of the invention, a shunt resistance 62, made of a conductive material such as copper, is also mounted on the circuit board 60 for facilitating sensing of the current and voltage on the wire 12. Thus the shunt 62 is used to sense both the current and the voltage, thereby allowing the energy consumption to be determined.

The shunt 62 includes an end 64 that is connected to the conductor layer 42 on the side 36 of the clamping portion 32 on a first side of the pocket 38. Similarly, an opposite end 66 of the shunt 62 is connected to the conductor layer 42 on the side 36 of the clamping portion 32 on the opposite side of the pocket 38. The shunt 62 and its connections to the conductor layers is illustrated by dashed lines in FIG. 2. It will be readily apparent to those skilled in the art from the foregoing description that the shunt 62 can be integrally coupled to the conductor layers 42 such that the shunt is essentially an extension of the conductor layers 42 on each side of the non-conductive base surface 39.

As will be described more fully below, the wire 12 is severed proximate the non-conductive base surface 39. The severed portion of the wire 12 on either side of the pocket 38 makes electrical contact with its respective conductor layer 42, and therefore electrically places the shunt 62 in series with the severed wire 12. Current from the power line is redirected through the shunt 62, thereby facilitating the sensing of the power line current and voltage. In one embodiment of the invention, a small voltage drop is created by the current flowing through the shunt resistance. The resulting voltage is fed into the metering circuit. Knowing the resistance of the shunt and the voltage drop across the shunt, the current can be easily calculated. Any known voltage monitoring technique can be used to measure the voltage. Further, other known manners of sensing the current can be used without departing from the scope and spirit of the invention, such as magnetic field sensors such as Hall Effect devices or current transformers, or induction coils can also be used to sense the current in the wires.

The circuit board 60 can also be provided with anti-surge and heat dissipation circuitry, including a surge resistance 68, which in one embodiment comprises a Nickel Chromium (NiCr) resistor.

In one embodiment of the invention, the metering and communications functions are integrally provided in a common unit. For example, these functions can be provided on a common printed circuit board 60, as depicted in FIG. 4. Advantages of combining the metering function and communications function in a single integrated unit include the ability to share components among the various functions. For example, the power supplied to the electronics must be protected from high voltage transients and it must be regulated, filtered, or otherwise conditioned before it is used by the metering and communications electronics. The diodes, capacitors, varistors and other components involved in power conditioning can form a single power supply that can serve both the metering and communications circuits. This is made possible by the integrated nature of the metering and communication functions. As another example, the metering and communications functions can share a common integrated circuit.

Other factors evidence the advantages of having metering and communications functions closely coupled. For example, energy consumption is derived by multiplying current and voltage parameters. However, a great deal of other useful electrical information can be derived from voltage and current, such as phase angles, power factor, noise, power outages, brown-outs, consumption patterns and peak loads. Closely coupling metering and communications functions facilitates measurement of these types of electrical information.

The meter 10 is also designed to allow it to be easily calibrated using an open loop calibration method. A typical meter uses closed loop calibration where the actual and expected meter readings are compared against each other, and the meter is iteratively adjusted until the actual and expected readings correspond. The meter 10 of the present invention, however, is programmable so that a measured, actual kWh value is simply programmed into the meter 10 to provide the calibration reference.

In order to accomplish the calibration in accordance with one embodiment of the invention, a plurality of light-emitting diodes (LEDs) 70 are provided on the circuit board 60. The enclosure 30 is provided with a window 72, shown in FIG. 2, positioned over the LEDs 70 to allow the LEDs 70 to be seen external to the enclosure 30. One of the LEDs 70 is configured to flash for each pulse emitted by the metering apparatus 20. As previously described, each pulse emitted by the metering apparatus 20 represents a predetermined unit of energy consumption. Thus, the number of optical pulses or "flashes" emitted by the LED which represents an actual energy consumption value can be counted, and multiplied by a stored calibration factor to calibrate the apparatus.

The enclosure 30, including the clamping portions 32, 34, are preferably made from tough, weather resistant materials in order to withstand the harsh operating environments of the device. Suitable materials include injection moldable polymeric resins, such as acrylonitrile butadiene styrene (ABS) or acetal resins such as Delrin®. Further, the portion of the enclosure 30 that contains the circuit board 60 is initially made hollow to allow mounting of the circuit board 60 therein. In one embodiment, the enclosure 30 is subsequently filled or potted with a material, such as the material used to form the enclosure 30, or a thermosetting material, whereby the enclosure becomes a substantially solid block of material. Potting of the enclosure 30 renders the electric components of the meter 10 resistant to shock and vibration, and further prevents moisture and other corrosive agents from contacting the circuitry.

An optional weather hood 74 illustrated in FIG. 2 can be disposed over the clamping portions 32, 34 to provide added resistance to adverse environmental conditions. The weather hood 74 includes apertures to allow passage of the wires 12, 14 through the enclosure 30 and the weather hood 74. However, these apertures and corresponding wires can be sealed to prevent ingress of moisture and other environmental contamination. The weather hood 74 otherwise seals the remainder of the coupling end of the enclosure 30 against environmental elements.

The meter 10 can be used with a variety of different wire gauges, such as wires from 16 AWG to 00 AWG. Further, while the meter 10 has been described as being used with two wires, the meter 10 is alternatively operable in connection with 3-phase systems having three or four wires, or 2-pole, 3-wire single phase systems. Modifications required to facilitate a 3-phase connection and 3-phase voltage and current sensing would be readily apparent to those skilled in the art from the 2-wire description provided herein.

Figure 5:
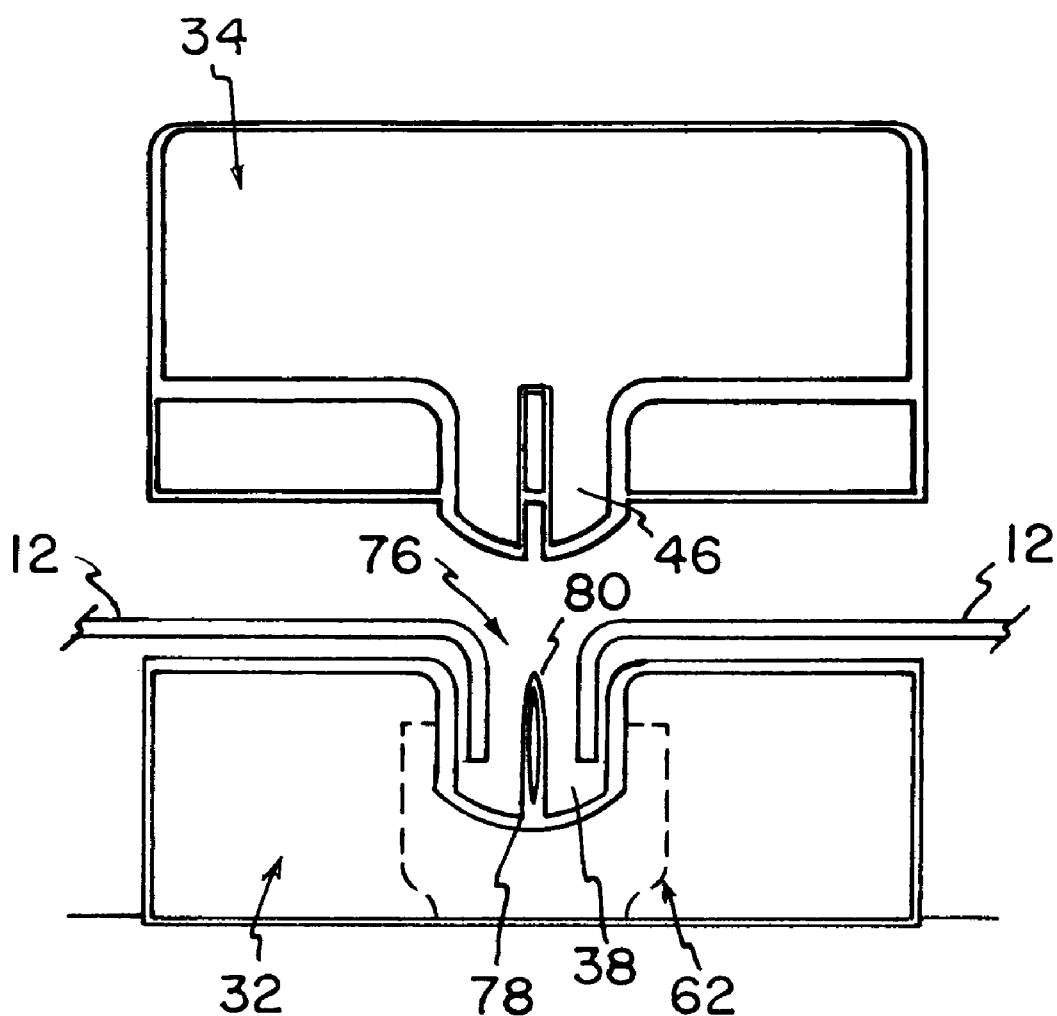
FIG. 5 is a side view of an embodiment of a clamping mechanism wherein the wire is cut so as to place selected portions of the power line meterering and communication apparatus is series with the severed power line.

FIG. 5 illustrates one embodiment of a wire severing apparatus used within the meter 10. In order to sense current and voltage, particularly current, sensing circuitry is placed in series with the power lines. The clamping portions 32, 34 are designed to cut the wire 12 such that the meter 10 is placed in series with the wire 12. The pocket 38 of the clamping portion 32 is provided with a cutting device 76 that severs the wire 12 as the wire is forced by the projection 46 down into the pocket 38, and further insulates the ends of the severed wire 12 from each other. In one embodiment, the cutting device 76 comprises a cutting projection 78 projecting upward from the base 39 of the pocket 38. The cutting projection 78 comprises an electrically insulating material to electrically isolate the severed ends of the wire 12 from each other. The projection 78 is sized so that it will be disposed between the ends of the wire when cut, thereby preventing the ends from contacting each other. In one embodiment of the invention, a cutting blade 80 is disposed atop the projection 78, and is constructed from a material capable of cutting through the wire 12, such as a metal blade. The cutting blade 80 is sharpened in order to allow the wire 12 to be severed by the blade 80. The severed ends of the wire 12 will remain clamped between the clamping portions 32, 34, with the bare portions of the wire 12 contacting the conductors 42 on the clamping portion 32. As previously described, a shunt resistance 62 can be connected across the conductors 42 which are separated by the non-conductive gap at the base of the pocket 38. Optionally, a relay circuit can be provided on the circuit board 60 to provide for remote disconnect by the meter 10.

Figure 6:
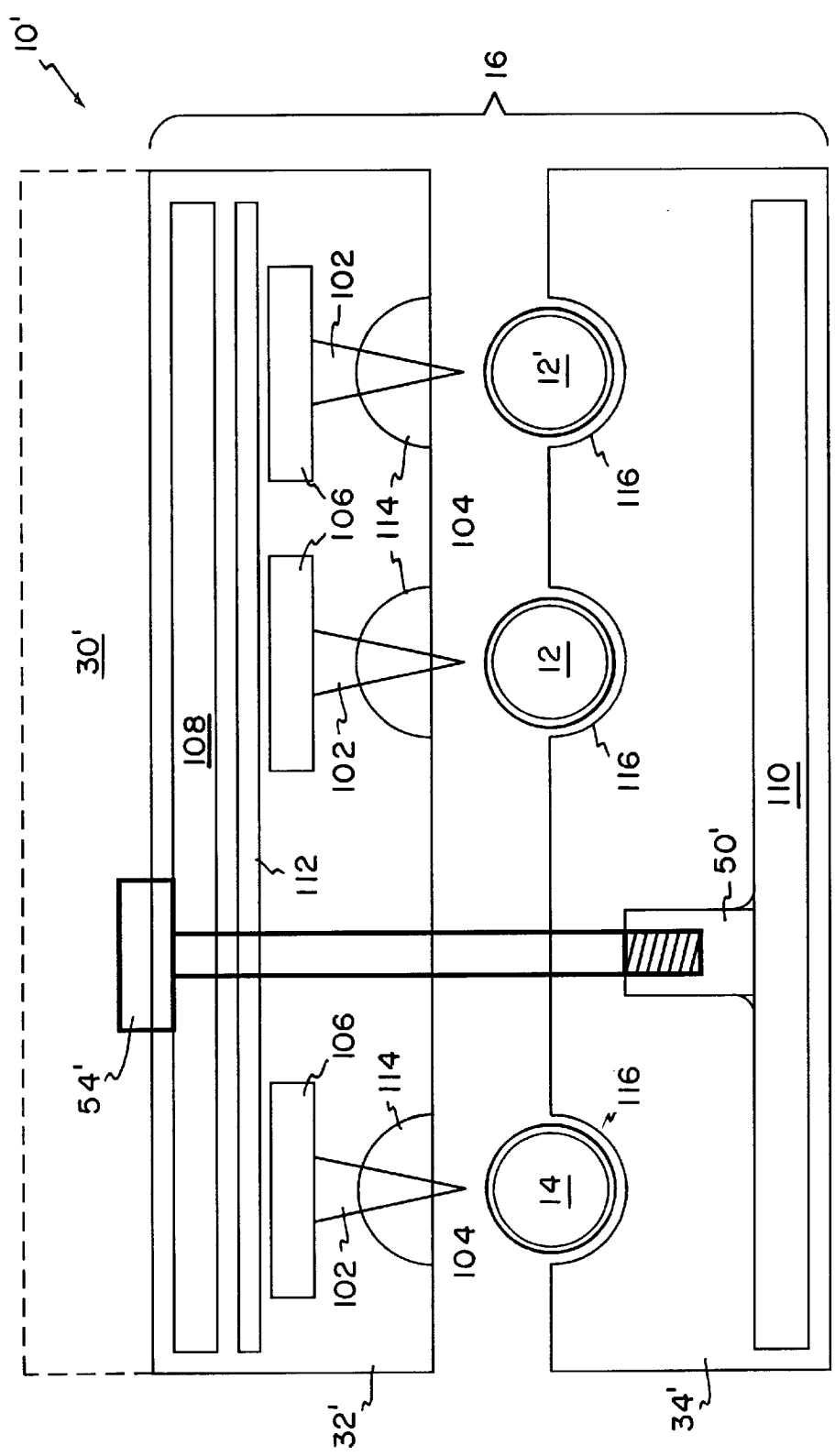
FIG. 6 is a cross-sectional side view of another embodiment designed for use with more than two power line conductors.
Figure 7:
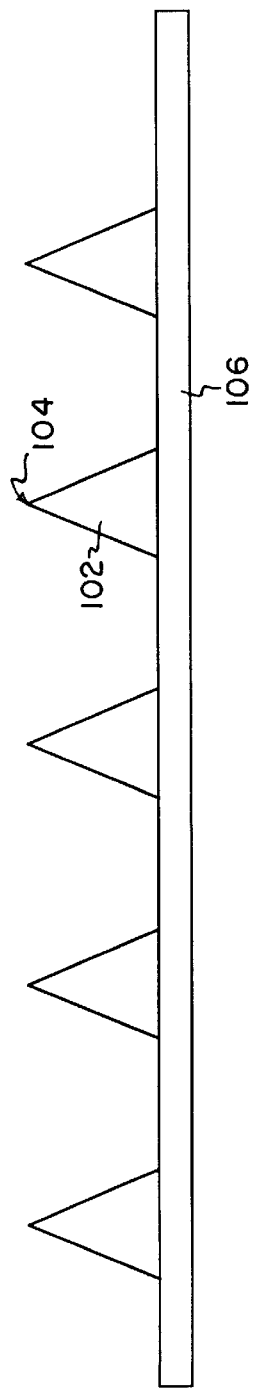
FIG. 7 illustrates a conducting bar and conductive barbs used in connection with a clamping embodiment that does not require stripping of the power line insulation.

FIGS. 6–7 illustrate an alternative embodiment of a meter 10' for use with insulated wires, wherein the insulation need not be removed prior to engagement with the meter. The example of FIG. 6 also illustrates the ability of the present invention to operate in a multiple wire system, such as in the U.S. where the power line includes three wires: a live or "hot" line 12, a neutral line 12', and a ground line 14. In this particular embodiment, both the live and neutral lines are coupled to resistive shunts, or alternative current and voltage monitoring circuitry. Additional wires can also be added, for example, in the case of 3-phase power lines having three alternate phase conductors and a neutral conductor.

The embodiment of FIGS. 6–7 is designed with conductors capable of piercing the insulation surrounding the wires in order to electrically contact the wires. The meter 10' is similar to the meter 10 in that it includes an enclosure 30' containing the current and voltage sensor(s) 18, the metering apparatus 20 and the communications apparatus 22. The power line coupling 16, in the form of a clamping mechanism, is provided at one end of the enclosure 30' for clamping onto the wires, in this case the wires 12, 12' and ground wire 14.

The coupling 16 includes a clamp portion 32' that is coupled to or integral with one end of the enclosure 30', and a second clamp portion 34' that is adapted to mate with, and be affixed to, the clamp portion 32'. However, in this embodiment, the threaded insert 50' is disposed in the clamp portion 34', while the clamp portion 32' is formed with a through-hole that receives the threaded member 54' so that the clamp portions 32', 34' can be securely drawn together.

The clamp portion 32' is provided with conductors 102 that extend outward from the bottom of the clamp portion 32' to facilitate an electrical connection with the wires 12, 12', 14 that are to be clamped between the clamp portions 32', 34'. The conductors 102 are designed to penetrate the insulating jacket surrounding the wires when the clamp portions 32', 34' are drawn together, thereby providing an electrical connection between the conductor 102 and its corresponding one of the wires 12, 12' 14. In one embodiment, the conductors 102 comprise cylindrical teeth or spikes having pointed tips 104 that project downward a sufficient distance from the bottom of the clamp portion to penetrate the insulating jacket of the wires to contact the wires when the clamp portions are drawn together. Cylindrical teeth or spikes have proved to work well for penetrating the insulating jacket, without requiring application of an unreasonable amount of force to draw the clamp portions 32', 34' together.

One end of each conductor 102 is connected to a conductive penetration bar 106 that is embedded within the clamp portion 32', which extends parallel to the longitudinal length of the wires. The penetration bars 106 are each formed from an electrically conductive material, such as hard drawn copper. As illustrated in FIG. 7, the penetration bars 106 of one embodiment are of sufficient length to accommodate a plurality of conductors 102. Each of the conductors 102 associated with one conductive bar 106 is electrically coupled to its respective bar 106 along its longitudinal length. In this manner, a plurality of conductors 102 bite into each wire to ensure adequate electrical contact with the wires when the clamp portions 32', 34' are clamped together. In one embodiment, each conductor 106 associated with wire 12 and 12' is coupled to a resistive shunt as previously described, which facilitates current and voltage monitoring for each of the current-carrying wires.

In order to ensure that even tension is exerted on all penetration bars 106 and conductors 102 when the clamp portions 32', 34' are drawn together, pressure plates 108, 110 are embedded within the clamp portions 32', 34', respectively. The pressure plates 108, 110 may be made of any substantially right material such as steel, and are disposed parallel to each other and parallel to the plane of the penetration bars 106. The threaded insert 50' is secured to the pressure plate 110, such as by welding or the like, and the threaded member 54' extends through the pressure plate 108. Therefore, when the threaded member 54' engages the threaded insert 50' to draw the clamp portions 32', 34' together, a substantially even pressure is exerted on each bar 106 and conductor 102.

A layer of insulating material 112 is preferably disposed between the penetration bars 106 and the pressure plate 108 in order to electrically isolate the bars from the plate. A suitable insulating material is a layer of electrical grade TEFLON®, which in one embodiment has a thickness of approximately 0.125 inches.

In the embodiment of FIG. 6, a shunt or other similar type of electrical connection is made between the penetration bars 106 and the electronic circuitry within the enclosure 30'. Further, in one embodiment, semi-circular recesses 114, 116 are formed in each of the clamp portions 32', 34' respectively, to generally match the cylindrical shape of the wires clamped therebetween. The recesses 114, 116 are aligned with each other to form cylindrical channels when the clamp portions 32', 34' are connected.

Once clamped in position, the meter 10' may be suitably sealed, such as by a weather hood similar to the weather hood 74 previously described, in order to protect the apparatus from moisture and other contamination.

To provide for wall or pole mounting of the metering and communication apparatus 10, 10', mounting flaps may be formed at suitable locations on the enclosures 30, 30', with the mounting flaps including holes through which a fastener can extend to connect the meter to a wall or pole.

Figure 8:
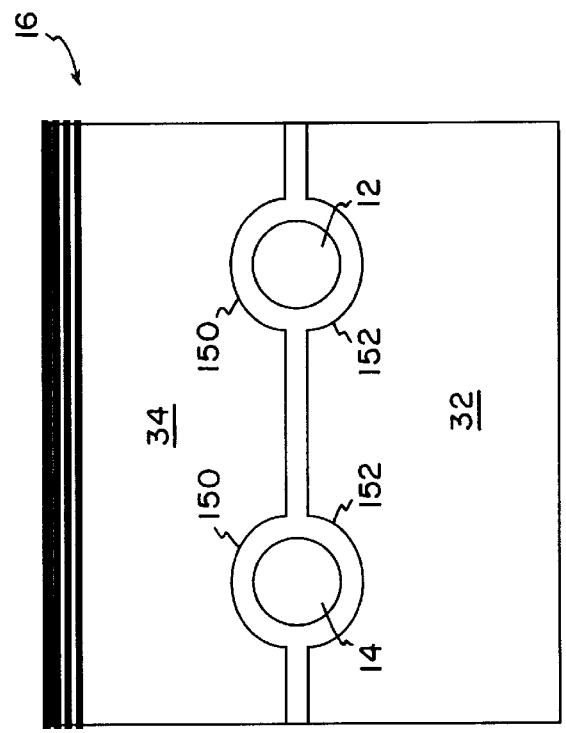
FIG. 8 illustrates an end view of yet another embodiment of the power line meterering and communication apparatus.

FIG. 8 illustrates a cross-sectional view of one physical embodiment of a power line coupling 16. While various embodiments of coupling mechanisms have been described, the coupling 16 of FIG. 8 illustrates one embodiment where the clamp portions 32, 34 include upper and lower semi-cylindrical recesses 150, 152 respectively. In this embodiment, the power line wires 12, 14 traverse the coupling 16 along cylindrical channels resulting from the mating of the upper and lower semi-cylindrical recesses 150, 152. This allows clamp portions 32 and 34 to be more closely mated, thereby reducing its vulnerability to environmental elements.

Figure 9:
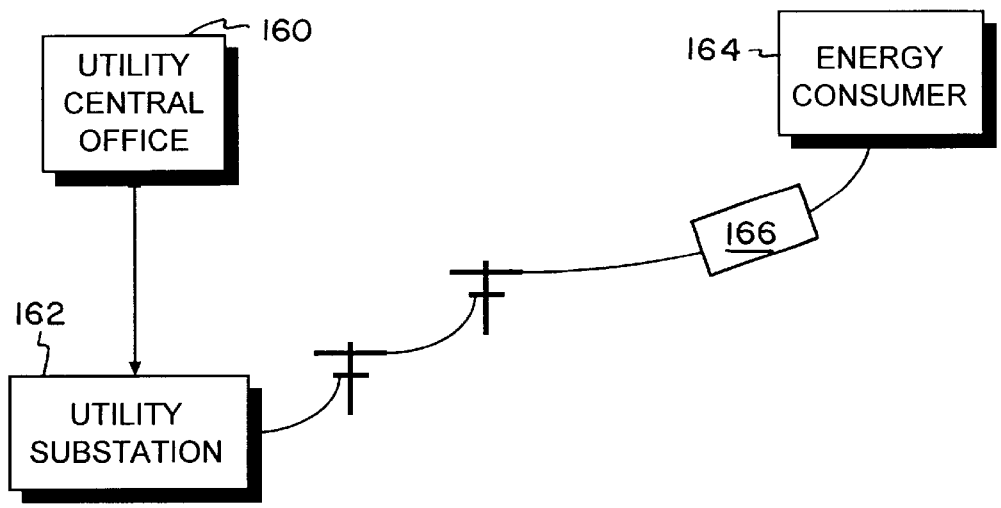
FIG. 9 is a block diagram of one link of a power distribution system distributing power between a utility substation and a power consumer, wherein a power line meterering and communication apparatus in accordance with the invention is employed.

As previously described, the present invention is particularly beneficial where energy consumption information is transmitted to a receiver using the power lines as the transmission medium. In these instances, no external wiring is required. As can be seen in FIG. 9, a utility central office 160 typically provides the bulk power to a utility substation 162 that in turn distributes power to various power customers, such as the energy consumer 164. Block 166 represents the integrated metering and communications of the present invention. In this illustration, it can be seen that no external wiring is required, and all components and circuitry are outside of the customer's premises. The ability to clamp such a metering device onto the power lines, together with the ability to directly communicate information via the same power line that is distributing power to the consumer, provides a virtually tamper-proof and environmentally durable all-in-one metering and communication device that consistently and indiscriminately monitors and transmits energy consumption information.

Power line service is typically provided to end power consumers using buried cable or overhead power lines. Overhead power lines are usually suspended between power poles or other structures, causing strain in one or more of the power line conductors. Most conventional energy/power meters are mounted on a building wall, pole or other similar fixed structure. The electrical connection to these conventional meters is typically made after the power line wires have been cut, and the strain in the overhead power line has been isolated or removed from the portion of the line being connected to the meter. The metering and communications apparatus of the present invention can be physically connected to a suspended power line, as illustrated in FIG. 9, while the power line is under strain. In other words, the metering and communications apparatus of the present invention requires no external power line strain relief apparatus to aid in installation or while in service. Instead, the various embodiments of the invention previously described account for strain in the power line, and provide internal strain relief when the power line is severed. This desirable feature allows the device to be connected to the power line at any desired location, e.g., on a suspended portion of the power line beyond a person's reach.

While the metering and communications apparatus 166 is capable of communicating information in various forms including the use of dedicated wiring techniques, the use of ultra narrow bandwidth (UNB) technology enhances its desirability. Generally, UNB technology is designed for long range communications by using low frequency transmission over very narrow bandwidths. Higher frequency transmission generally corresponds to a need for greater bandwidths, which in turn corresponds to a need for greater transmission power. UNB, on the other hand, uses very narrow bandwidths at low frequencies, allowing transmitters to be physically small. In the present invention, the transmitter is commonly housed with the energy meter reading apparatus and coupled directly to the power lines, and a smaller transmitter is therefore preferred. Therefore, in one embodiment of the invention, UNB technology is utilized to provide an integrated metering and communications apparatus requiring no auxiliary connections, while providing accurate meter information to a utility central office, substation, billing office or other desired receiving station using only the power line as a transmission medium. The description provided in connection with FIG. 10 below provides one particular technique for which such a low frequency, narrow bandwidth energy consumption signal may be transmitted via the power lines.

Figure 10:
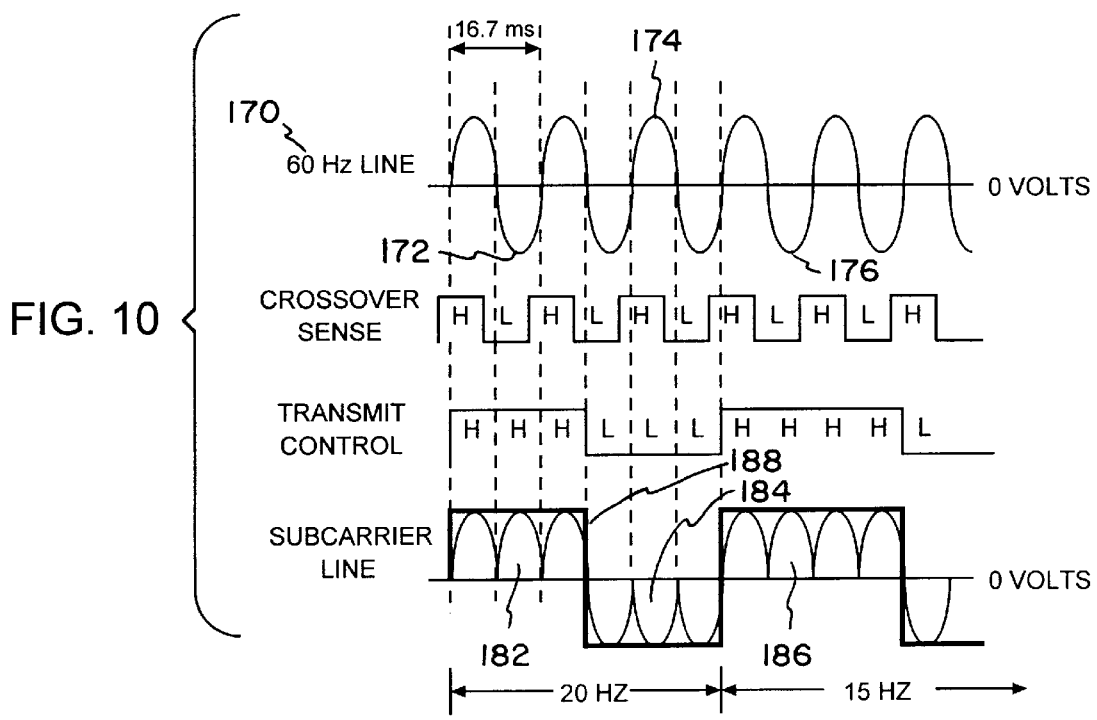
FIG. 10 is a waveform diagram illustrating one embodiment in which a low frequency energy consumption signal is derived using the frequency of the power signal as a carrier signal.

FIG. 10 is a waveform diagram illustrating one embodiment in which a low frequency energy consumption signal is derived using the frequency of the power signal as a carrier signal. The 60 Hz line represents a power transmission signal 170 on a power distribution line which can be used as a carrier for the resulting energy consumption signal. The 60 Hz power signal is a sinusoidal signal having a period of approximately 16.7 milliseconds. A zero-crossover point can be estimated using techniques known in the art. Using such an estimation, selected half-period waveforms can be inverted (or phase-shifted 180 degrees at the near-zero crossing). For example, the half-period waveforms 172, 174 and 176 can be inverted or phase-shifted to produce corresponding inverted half-period waveforms 182, 184 and 186 respectively. Digital signal processing can be used to provide low-pass filtering to allow only the low frequency to pass. As can be seen, an approximate square wave signal 188 having a frequency of approximately 20 Hz can be generated for the first period of the energy consumption signal by inverting the selected portions of the 60 Hz signal 170. Any frequency having a period which is an integer value of one-half of the carrier period can be generated in a similar manner. Similarly, using the known technique of Direct Digital Synthesis (DDS), any frequency lower than the power line frequency can be generated. This generates a low-frequency subcarrier signal to be modulated onto a carrier having a higher frequency than the subcarrier signal.

In the example of FIG. 10, frequency modulation is providing the control signal, as can be seen by the variance between 20 Hz and 15 Hz. Subcarrier signals lasting for 1.5 periods of the 60 Hz signal are 20 Hz signals, and subcarrier signals lasting for 2 full periods of the 60 Hz signal are 15

Hz signals. This frequency modulation allows the energy consumption signal to be superimposed on the power signal at a lower frequency than the power signal. As will be recognized by those skilled in the art, phase modulation, or a combination of phase modulation and frequency modulation, could also be implemented in a similar manner without departing from the scope and spirit of the invention. Therefore, the embodiment described herein is merely illustrative, and should not be limited to a frequency modulated system.

As noted above, the present invention is susceptible to various modifications, modes of operation and embodiments without departing from the scope and spirit of the invention. For example, the present invention is applicable where the information to be transmitted to the receiving office is not "power" or "energy" information. Other information can be obtained by monitoring the characteristics of the power signal. For example, current-related information may be desired, such as a maximum or "peak" current value, a minimum current value, an average current value, or the total current utilized by a consumer in a predetermined time period. Similarly, voltage-related information may be desired, such as a peak voltage value, a minimum voltage value, an average or RMS voltage value, and the like. As a specific example, in one embodiment, the present invention includes a device to absorb voltage surges, yet it may be beneficial to transmit information indicating the occurrence of such a voltage surge. Actual voltage and current monitoring methods for ascertaining these types of current or voltage related information are generally known in the art. The present invention provides an economical, convenient, reliable, and virtually tamper-proof manner of recognizing and communicating such information, as well as energy consumption information. Further, loss of power to a consumer can also be recognized by a receiving office where no signal is relayed back to the receiving office. This is certainly conceivable where power lines have been downed due to accidental or weather-related factors.

It is therefore to be understood that various modifications and additions can be made to the various embodiments discussed hereinabove without departing from the scope or spirit of the present invention. Accordingly, the scope of the present invention should not be considered limited to the particular examples described above, but rather should be understood to cover all aspects of the invention as fairly set out in the attached claims. Various modifications to which the present invention will be applicable will be readily apparent to those of skill in the art upon review of the present specification.

We claim:

1. A power line metering and communication apparatus for measuring electrical information on a power line, comprising:

a housing;

a coupling mechanism attached to the housing to physically connect the housing to a suspended power line under strain, and to provide an electrical connection to one or more conductors of the suspended power line, the coupling member including a clamp portion and a cutting device to sever a current-carrying one of the power line conductors;

metering apparatus disposed within the housing and electrically coupled to the power line conductors via the coupling mechanism, wherein the metering apparatus comprises at least a current monitor and a voltage monitor to measure the power line current and power line voltage; and a communications apparatus disposed within the housing and coupled to the metering apparatus to communicate information derived from the power line current and voltage measurements to a remote location.

2. The power line metering and communication apparatus as in claim 1, wherein one of the first and second clamp portions includes a pocket, and the other of the first and second clamp portions includes a projection that is receivable within the pocket to guide a current-carrying one of the power line conductors into the pocket.

3. The power line metering ad communication apparatus as in claim 1, further comprising a magnetic current sensor positioned proximate the current-carrying conductors to sense the power line current therethrough, and wherein the current monitor measures the power signal current sensed by the magnetic current sensor.

4. The power line metering and communication apparatus as in claim 1, wherein each of the first and second clamp portions is provided with recesses adapted to receive the power line conductors, wherein the recesses on the first and second clamp portions are physically aligned to envelop the corresponding power line conductors.

5. The power line metering and communication apparatus as in claim 1, wherein the housing is substantially filled with a non-conductive material.

6. The power line metering and communication apparatus as in claim 1, wherein the metering apparatus comprises an integrated circuit to receive a current value and a voltage value from the current monitor and voltage monitor respectively, and to output an energy consumption indication in response thereto.

7. The power line metering and communication apparatus as in claim 1, wherein the communications apparatus is connected to the power line for communicating the measured information via the power line.

8. The power line metering and communication apparatus as in claim 1, wherein the communications apparatus includes a wireless transmitter to communicate the measured information to the remote location.

9. The power line metering and communication apparatus as in claim 1, wherein the communications apparatus includes a digital interface to communicate the measured information via a dedicated digital interface using a digital transmission protocol.

10. The power line metering and communication apparatus as in claim 1, further comprising a shunt resistance coupled in series with a current-carrying conductor of the power line, wherein the current monitor measures a power signal current on the power line by measuring the current through the shunt resistance.

11. The power line metering and communication apparatus as in claim 1, wherein:

the housing comprises an enclosure to enclose the metering apparatus and the communications apparatus, wherein the enclosure is substantially filled with a non-conductive material; and the coupling mechanism is connected to the enclosure to provide a unitary package for the metering and communications apparatus.

12. The power line metering and communication apparatus as in claim 1, wherein one of the first and second clamp portions includes conductive elements thereon, the conductive elements adapted to electrically engage current-carrying conductors of the power line.

13. The power line metering and communication apparatus as in claim 12, wherein each of the conductive elements comprises one or more conductive barbs capable of piercing a dielectric sheath on the current-carrying conductors to electrically connect the conductive elements to the current-carrying conductors.

14. The power line metering and communication apparatus as in claim 1, wherein one of the first and second clamp portions includes a cutting device to sever a current-carrying one of the power line conductors.

15. The power line metering and communication apparatus as in claim 14, wherein:

the cutting device comprises a dielectric barrier to electrically isolate severed portions of the current-carrying conductors; and the first and second clamp portions includes at least two conductive elements thereon, each of the conductive elements adapted to electrically engage one of the severed portions of the current-carrying conductors.

16. The power line metering and communication apparatus as in claim 15, further comprising a shunt resistance coupled in series with the severed portions of the current-carrying conductors via associated ones of the conductive elements, and wherein the current monitor measures the power line current by measuring the current through the shunt resistance.

17. The power line metering and communication apparatus as in claim 1, wherein the communications apparatus is electrically coupled to the power line conductors via the coupling mechanism to communicate the measured information via a carrier signal on the power line.

18. The power line metering and communication apparatus as in claim 17, wherein the communications apparatus comprises an ultra narrow bandwidth transmitter to communicate the measured information using the power signal on the power line as a subcarrier signal.

19. The power line metering and communication apparatus as in claim 17, wherein the measured information is communicated using a lower frequency than a frequency of a power signal transmitted on the power line.

20. A power line metering and communication apparatus for measuring electrical information on a power line, comprising:

a housing;

a coupling mechanism attached to the housing to physically connect the housing to a suspended power line under strain, and to provide an electrical connection to one or more conductors of the suspended power line;

metering apparatus disposed within the housing and electrically coupled to the power line conductors via the coupling mechanism, wherein the metering apparatus comprises at least a current monitor and a voltage monitor to measure the power line current and power line voltage, the voltage monitor comprising a voltage sensor coupled to a current-carrying conductor of the power line and coupled to a reference voltage to measure a power signal voltage on the power line; and a communications apparatus disposed within the housing and coupled to the metering apparatus to communicate information derived from the power line current and voltage measurements to a remote location.

21. A power line metering and communication apparatus for measuring electrical information on a power line, comprising:

a housing;

a coupling mechanism attached to the housing to physically connect the housing to a suspended power line under strain, and to provide an electrical connection to one or more conductors of the suspended power line, wherein the coupling mechanism comprises a wire support structure to physically support the connected portion of the suspended power line within the housing without requiring release of the strain in the suspended power line, and wherein strain relief for the connected portion of the suspended power line is provided via the wire support structures:

metering apparatus disposed within the housing and electrically coupled to the power line conductors via the coupling mechanism, wherein the metering apparatus comprises at least a current monitor and a voltage monitor to measure the power line current and power line voltage; and a communications apparatus disposed within the housing and coupled to the metering apparatus to communicate information derived from the power line current and voltage measurements to a remote location.

22. A power line metering and communication apparatus for recognizing and communicating electrical current-related information, comprising:

a housing;

a coupling mechanism attached to the housing to physically connect the housing to the power line and to provide an electrical connection to one or more conductors of the power line, wherein the coupling mechanism comprises a strain relief mechanism to facilitate the connection of the housing to a suspended portion of the power line without a need for external strain relief;

current monitoring apparatus disposed within the housing and electrically coupled to the power line conductors via the coupling mechanism to measure current-related signals, wherein the current monitoring apparatus comprises a current monitor to measure the current signal traversing the power line; and a communications apparatus disposed within the housing and electrically coupled to the current monitoring apparatus to communicate information derived from the measured current-related signals to a remote location.

23. The power line metering and communication apparatus as in claim 22, wherein the current-related information is selected from the group comprising a maximum current value, a minimum current value, and an average current value over a predetermined time period.

24. A power line metering and communication apparatus for recognizing and communicating electrical voltage-related information, comprising:

a housing;

a coupling mechanism attached to the housing to physically connect the housing to the power line and to provide an electrical connection to one or more conductors of the power line, wherein the coupling mechanism comprises a strain relief mechanism to facilitate the connection of the housing to a suspended portion of the power line without a need for external strain relief;

voltage monitoring apparatus disposed within the housing and electrically coupled to the power line conductors via the coupling mechanism to measure voltage-related signals, wherein the voltage monitoring apparatus comprises a voltage monitor to measure the voltage signal on the power line; and a communications apparatus disposed within the housing and coupled to the voltage monitoring apparatus to communicate information derived from the measured voltage-related signals to a remote location.

25. The power line metering and communication apparatus as in claim 24, wherein the voltage-related information is selected from the group comprising a peak voltage value, a minimum voltage value, and an average voltage value.

26. A method of metering energy consumption on a power line, comprising:

attaching a housing to a suspended portion of the power line, wherein the housing contains at least a metering apparatus for measuring energy consumption and a communications apparatus;

providing strain relief for the portion of the suspended power line attached to the housing, wherein the strain relief is provided from within the housing, thereby requiring no external strain relief;

electrically coupling the metering apparatus to the power line;

metering the watt-hours of energy consumed via the power line;

transmitting a signal corresponding to the watt-hours of energy consumed to a remote location via the communications apparatus.

27. The method of claim 26, wherein transmitting a signal comprises transmitting the signal by modulating the signal onto a power signal carried on the power line.

28. The method of claim 26, wherein transmitting the signal comprises transmitting the signal using a power signal as a subcarrier signal such that the signal is transmitted using a lower frequency than a frequency of the power signal.

29. The method of claim 26, wherein electrically coupling the metering apparatus to the power line comprises:

clamping the housing to the power line;

electrically contacting selected power line conductors of the power line; and coupling the selected power line conductors to the metering apparatus.

30. The method of claim 29, wherein electrically contacting selected power line conductors comprises severing a selected one of the power line conductors and coupling the metering apparatus in series with the severed power line conductor.

31. A system for metering and communicating power consumption information; comprising:

a power source to provide a power signal;

power distribution lines coupled to distribute the power signal from the power source to one or more power consumers; and an integrated power metering and communication apparatus for each of a selected group of the one or more power consumers to measure the power consumed by each of the selected group of power consumers, the integrated power metering and communication apparatus comprising:

a housing;

a coupling mechanism attached to the housing to physically connect the housing to a suspended portion of the power distribution line leading to a corresponding one of the power consumers, and to provide an electrical connection to one or more conductors of the power distribution line, wherein the coupling mechanism comprises a wire support structure to physically support the suspended portion of the power distribution line within the housing without requiring release of the strain in the suspended power distribution line, and wherein any required strain relief for the suspended portion of the power distribution line is provided entirely via the wire support structure, thereby eliminating the need for external strain relief;

a metering apparatus disposed within the housing and electrically coupled to the power line conductors via the coupling mechanism, wherein the metering apparatus comprises at least a current monitor and a voltage monitor to measure the power line current and power line voltage on the power line conductors; and a communications apparatus disposed within the housing and coupled to the metering apparatus to communicate information derived from the power line current and voltage measurements to a remote location.

* * * * *